United States Patent

Levell

[15] 3,667,067

[45] May 30, 1972

[54] ELECTRONIC CIRCUIT SUITABLE FOR USE AS FREQUENCY SELECTIVE AMPLIFIER OR OSCILLATOR

[72] Inventor: Derek Alfred Levell, 88 Galley Lane, Arkley, Barnet, England

[22] Filed: Mar. 18, 1971

[21] Appl. No.: 125,723

[30] Foreign Application Priority Data

Mar. 23, 1970 Great Britain......................14,038/70

[52] U.S. Cl...................................331/59, 330/21, 330/107, 330/151, 331/65, 331/108 B, 331/135, 331/179, 333/70 CR

[51] Int. Cl............................................................H03b 5/20

[58] Field of Search.............331/108 B, 65, 135, 137, 177 R, 331/179, 59; 330/21, 85, 107, 112, 151, 185; 333/70 CR

[56] References Cited

UNITED STATES PATENTS 2,758,211 8/1956 Hochman..............................331/135

2,971,165 2/1961 Linn..................................331/137 X

*Primary Examiner*—Roy Lake
*Assistant Examiner*—Siegfried H. Grimm
*Attorney*—Holman & Stern

[57] ABSTRACT

An electronic circuit has two similar phase shift networks connected in cascade between a circuit input and the input of an amplifier providing a 180° phase-shift between its input and output. The output of the amplifier and first network are combined and the combination applied to the circuit output, providing an overall frequency response exhibiting a resonant frequency. The networks may be connected together via a buffer amplifier, and each comprises a resistance and a reactance interconnected to provide a phase lead or lag. The resonant frequency may be varied by varying the gain of the amplifier or the resistance or reactance of one or both networks. Variable gain feedback circuitry may be connected between the circuit output and input, so that the circuit is selectively operable as a frequency selective amplifier or oscillator in accordance with the gain of this circuitry.

12 Claims, 4 Drawing Figures

INVENTOR
DEREK ALFRED LEVELL

INVENTOR
DEREK ALFRED LEVELL

INVENTOR
DEREK ALFRED LEVELL

INVENTOR
DEREK ALFRED LEVELL

ELECTRONIC CIRCUIT SUITABLE FOR USE AS FREQUENCY SELECTIVE AMPLIFIER OR OSCILLATOR

The present invention relates to an electronic circuit comprising amplifying devices with networks of resistances and reactances arranged so as to generate or selectively amplify electrical oscillations, suitable for use as a frequency selective amplifier or an oscillator.

SUMMARY OF THE INVENTION

In accordance with the present invention, an electronic circuit comprises: a first phase-shift network having an input constituting the circuit input and an output; a second phase-shift network having an input connected to the output of said first phase-shift network, whereby the first and second networks are connected in cascade, and an output; amplification circuitry having an input and an output and having its input connected to the output of said second phase-shift network and being adapted to deliver at its output an output signal in anti-phase with a corresponding input signal; summation circuitry having a first input connected to the output of said amplification circuitry, a second input connected to the output of said first phase-shift network and an output constituting the circuit output, whereby the circuit has an overall frequency response exhibiting a resonant frequency.

Other objects and advantages will appear from the following description of an example of the invention, when considered in connection with the accompanying drawings, and the novel features will be particularly pointed out in the appended claims.

IN THE DRAWINGS

DESCRIPTION OF THE PREFERRED EMBODIMENT

Figure 1:
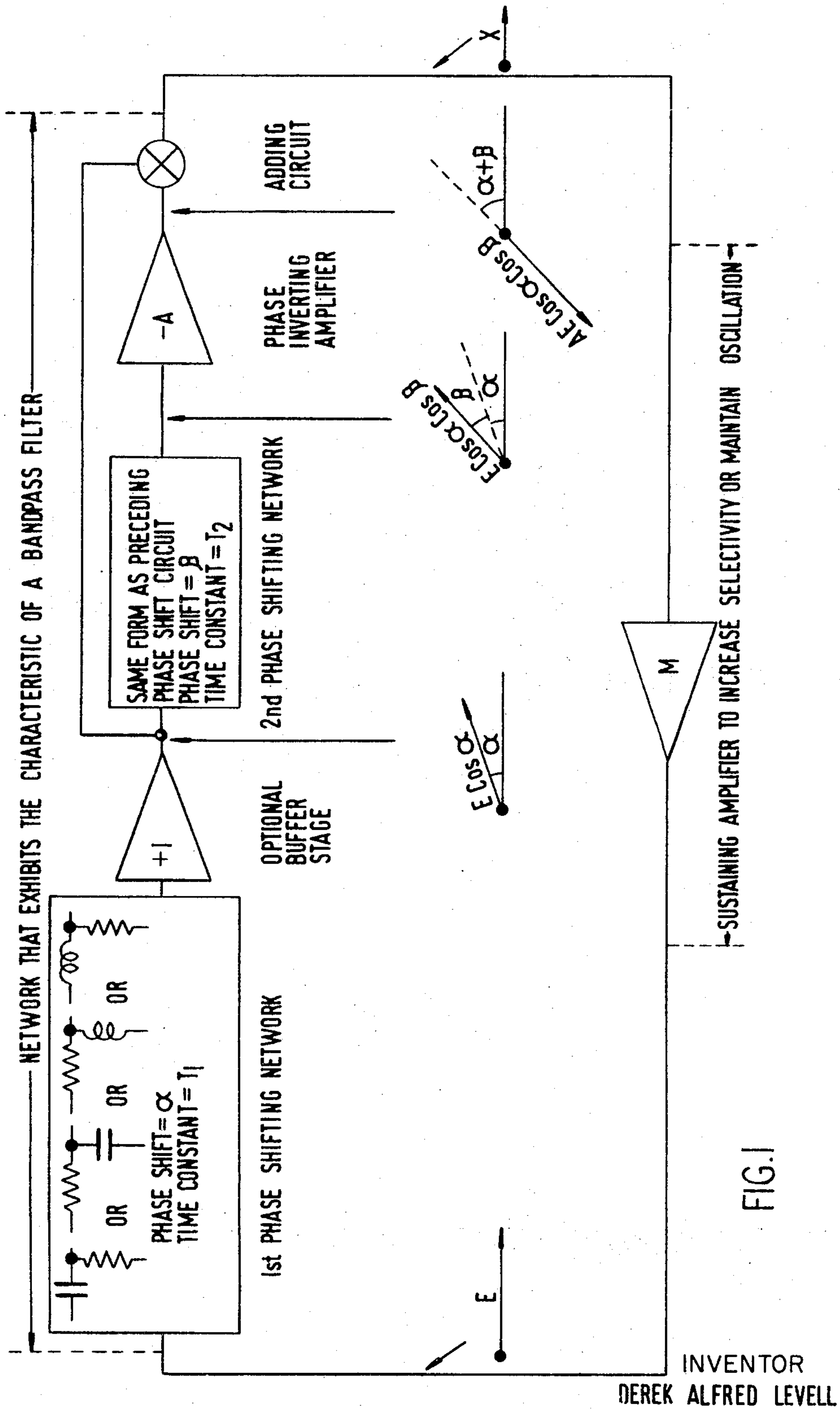
FIG. 1 is a schematic circuit diagram of the circuit.

The basic circuit arrangement of the present invention is as depicted in FIG. 1. This shows an input signal depicted as a vector of amplitude $E$ fed into two similar phase shifting networks that are connected in cascade either directly or through a buffer stage. The output of the second phase shifting network is then amplified and inverted by an amplifier of gain depicted as $-A$, and then added to the output of the first phase shifting network to provide a resultant output depicted as a vector of amplitude $X$. The amplitude response of this arrangement with frequency variation can be shown to have a resonant frequency at which the output $X$ is in phase with the input $E$ and where the overall loss through the arrangement is a function of the component values used in the phase shifting networks but is independent of the gain $-A$ of the phase inverting amplifier. The arrangement thus exhibits the characteristics of a band pass filter network. The resonant frequency can be shown to be a function of the component values used in the phase shifting networks and also a function of the gain $-A$ of the phase inverting amplifier. Variation of the resonant frequency of the arrangement can thus be made by adjustment of the gain $-A$ with the feature that the overall loss through the arrangement remains unchanged. The variation of the gain $-A$ can be accomplished by means of a single track variable resistor whereas known circuit arrangements such as described in British Patent Specifications nos. 497, 148 and 489,849 require the use of dual ganged components to tune the circuits without the introduction of an accompanying change of the circuit loss. The present invention is not however to be restricted solely to tuning by variation of the gain of the phase inverting amplifier as it is also possible to tune the arrangement by means of dual ganged components controlling the two phase shifting networks in a way that produces a change of resonant frequency without an accompanying change of circuit loss. There are actually advantages in the use of the present invention with tuning by dual ganged components as against the use of those circuit arrangements described in the aforementioned British Patent Specifications. A particular advantage being that when a dual variable capacitor is used for tuning the present invention it can be used in an arrangement with a common capacitor connection at earth potential whereas the circuit arrangements in the aforementioned British Patent Specifications require the common capacitor connection to be insulated from earth potential. A further advantage is that an initial preset adjustment of the gain $-A$ can be used as a means to overcome errors in the phase shifting networks due to component tolerances.

The basic circuit of FIG. 1 is completed by adding a sustaining amplifier of depicted gain $M$ between the output of the adding circuit and the input of the first phase shifting network. The gain $M$ is set equal to the loss through the active filter arrangement in order to produce a sinusoidal oscillation generator. The gain $M$ is reduced marginally in order to convert the circuit from an oscillation generator into a selective amplifier.

ANALYSIS OF CIRCUIT WITH A BUFFER STAGE

The operation of the circuit given in FIG. 1 can be explained as follows. Consider $\alpha$ and $\beta$ to be the phase shifts on the first and second phase shifting networks respectively. Assume that $E$ is the amplitude of a sinusoidal input present at the input of the first phase shifting network and that the output of each phase shifting network is not affected by the loading presented by the following circuits, then the signal at the output of the first phase shifting network is of amplitude $E \cos \alpha$ and is of phase angle $\alpha$ relative to the phase of the input $E$. The output of the second phase shifting network is thus of amplitude $E \cos \alpha \cos \beta$ and is of phase angle $(\alpha+\beta)$ relative to the phase of the input $E$. This is amplified by $-A$ times and added to the output of the first phase shifting network to give a signal that can be considered as the sum of a component $X$ in phase with the input $E$ and a component $Y$ in quadrature to the input $E$. It follows that, $$X = E\cos^2\alpha - AE\cos\alpha\cos\beta\cos(\alpha+\beta) \qquad 1$$

and $$Y = E\cos\alpha\sin\alpha - AE\cos\alpha\cos\beta\sin(\alpha+\beta) \qquad 2$$

Now, if the circuit is to maintain a state of sinusoidal oscillation it follows that $Y=0$ so that from equation 2, $$A = \frac{\sin\alpha}{\cos\beta\sin(\alpha+\beta)} \qquad 3$$

which may be substituted in equation 1 to give, $$X = E\tan\beta/(\tan\alpha+\tan\beta) \qquad 4$$

This signal is amplified by the sustaining amplifier of gain $M$ to produce the input signal $E$. The minimum gain $M$ required to maintain oscillation is thus $$M = (E/X) = 1 + (\tan\alpha/\tan\beta) \qquad 5$$

a. Conditions when "Integrators" produce the phase shifts.

When the first phase shifting network comprises a lag circuit of time constant $T_1$ it can be shown that $\tan\alpha = WT_1$ where $W$ is the angular frequency. Similarly if the second phase shifting network comprises a lag circuit of time constant $T_2$ it follows that $\tan\beta = WT_{ut2}$. Substitution in equation 5 thus gives:

$$M = 1 + (T_1/T_2) \qquad 6$$

which is obviously independent of frequency.

Equation 3 can be shown to be equivalent to:

$$A = (1+\tan^2\beta)/(1+\tan\beta/\tan\alpha) \qquad 7$$

so that $$A = (1+W^2T_2^2)/(1+T_2/T_1) \qquad 8$$

which gives $$W = \frac{\sqrt{A(1+T_2/T_1)-1}}{T_2} \qquad 9$$

When $T_1 = T_2 = T$ equation 6 becomes $M = 2$ and equation 9 becomes $$W = \frac{\sqrt{2A-1}}{T} \qquad 10$$

b. Conditions when "Differentiators" produce the phase shifts.

When the first phase shifting network comprises a lead circuit of time constant $T_1$ and the second phase shifting network comprises a lead circuit of time constant $T_2$ it follows that $\tan\alpha = 1/WT_1$ and $\tan\beta = 1/WT_2$. Substitution in equation 5 then gives $$M = 1 + (T_2/T_1) \qquad 11$$

which is again independent of frequency.
Equation 7 becomes $$A = (1 + 1/W^2T_2^2)/(1 + T_1/T_2) \qquad 12$$

which gives $$W = \frac{1}{T_2\sqrt{A(1+T_1/T_2)-1}} \qquad 13$$

When $T_1 = T_2 = T$ equation 11 becomes $M = 2$ and equation 13 becomes $$W = \frac{1}{T\sqrt{2A-1}} \qquad 14$$

Analysis of Circuit without a Buffer Stage
a. Dual Integrator Circuit

Figure 2:
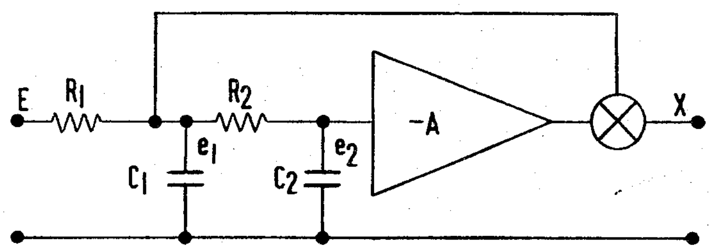
FIGS. 2 and 3 are block diagrams of two forms of circuit.

The circuit shown in FIG. 2 consists of two cascaded integrator circuits of time constants $T_1 = C_1R_1$ and $T_2 = C_2R_2$. Although the $R - C$ form of integrator is shown the circuit could alternatively consist of the equivalent $L - R$ integrator circuit.

Assume that $e_1$ and $e_2$ are the voltages across $C_1$ and $C_2$ then it follows that the basic equations for the circuit can be expressed in vector algebra as follows:

$$e_2 = \frac{e_1}{1+pC_2R_2} = \frac{e_1}{1+pT_2} \qquad 15$$

$$e_1 = \frac{\frac{E}{pC_1}\left(R_2+\frac{1}{pC_2}\right)}{R_1\left(\frac{1}{pC_1}+\frac{1}{pC_2}+R_2\right)+\frac{1}{pC_1}\left(R_2+\frac{1}{pC_2}\right)} = \frac{1+pT_2}{pT_1(1+pT_2+C_2/C_1)+1+pT_2} \qquad 16$$

and $$X = e_1 - Ae_2 \qquad 17$$

It follows from equations 15, 16 and 17 that $$\frac{X}{E} = \frac{1-A-p^2T_2(AT_1+T_2+C_2R_1) + p[p^2T_1T_2^2-T_1-C_2R_1+A(T_1+T_2+C_2R_1)]}{(1+p^2T_1T_2)^2-p^2(T_1+T_2+C_2R_1)^2} \qquad 18$$

Equating the imaginary part of this equation to zero gives $$p^2T_1T_2^2 - T_1 - C_2R_1 + A(T_1 + T_2 + C_2R_1) = 0 \qquad 19$$

$$\therefore -p^2 = \frac{A(T_1+T_2+C_2R_1)-T_1-C_2R_1}{T_1T_2^2} \qquad 20$$

i.e. $W^2 = [A(1 + T_1/T_2 + R_1/R_2) - (T_1/T_2 + R_1/R_2)]/T_1T_2$ 21

Taking the remaining real part of equation 18 and eliminating p by the use of equation 20 gives the loss of the circuit arrangement of FIG. 2 at the resonant frequency as $$X/E = 1/(1 + T_1/T_2 + R_1/R_2) \qquad 22$$

so that the minimum gain $M$ required on a sustaining amplifier to produce oscillations is $$M = \cong E/X = 1 + T_1/T_2 + R_1/R_2 \qquad 23$$

It will be seen that this equation is completely independent of $A$ and equation 21 shows that a frequency change can be produced by a variation of $A$.

When $T_1 = T_2 = T$ and $R_1 = R_2$ equation 23 gives $M = 3$ and equation 21 gives $$W = \frac{\sqrt{3A-2}}{T} \qquad 24$$

b. Dual Differentiator Circuit

Figure 3:
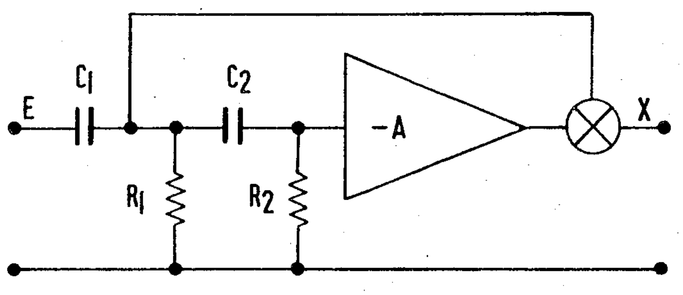

The circuit shown in FIG. 3 consists of two cascaded differentiator circuits of time constants $T_1 = C_1R_1$ and $T_2 = C_2R_2$. Alternatively the equivalent $R - L$ differentiator configuration can replace the $C - R$ configuration. Analysis of this circuit in the same manner as that employed for the preceding dual integrator circuit gives the following results:

$$W^2 = 1/T_2^2[A(1 + T_1/T_2 + R_1/R_2) - 1 - R_1/R_2] \qquad 25$$

and $$M = 1 + T_2/T_1 + C_2/C_1 \qquad 26$$

When $T_1 = T_2 = T$ and $C_1 = C_2$ equation 26 gives $M = 3$ and equation 25 gives $$W = \frac{1}{T\sqrt{3A-2}} \qquad 27$$

Methods of Tuning the Circuit Arrangement

In order to cover a wide range of resonant frequencies it is usual to vary both the resistance and reactance components of circuits such as those described in the aforementioned British Patent Specifications. The circuit arrangement of FIG. 1 can similarly be tuned by varying both the resistance and reactance component of the phase shifting circuits. Comparison of the formulae giving the resonant frequencies of the circuits in the aforementioned British Patent Specifications with those derived for the circuit arrangement of FIG. 1 shows that $W = 1/T$ for all circuits when the gain $A = 1$ and $T$ = time constant of each phase shifting circuit. The circuit of FIG. 1 can thus be tuned by the same methods as those used to tune the previously known circuit arrangements including the so called "Decade" method of tuning as described in British Patent Specification No. 524, 314, In all cases the use of the circuit arrangement of FIG. 1 has the advantage that increased tuning range can be obtained by variation of the gain $-A$ of the phase inverting amplifier with the introduction of no change of circuit loss in the resonant filter circuit. The control that varies the gain $-A$ may be a preset control which corrects for errors in the values of the time constants in the phase shifting networks or a variable control which could be calibrated in terms of frequency or percentage deviation of frequency. The gain $-A$ may be varied by any known methods normally employed with amplifiers.

There are known ways of varying the gain of an amplifier by changes in voltage, light, heat and pressure so that the present invention provides a convenient means of converting changes in physical quantities into changes of the frequency of an oscillation.

Practical Oscillator Circuit

Figure 4:
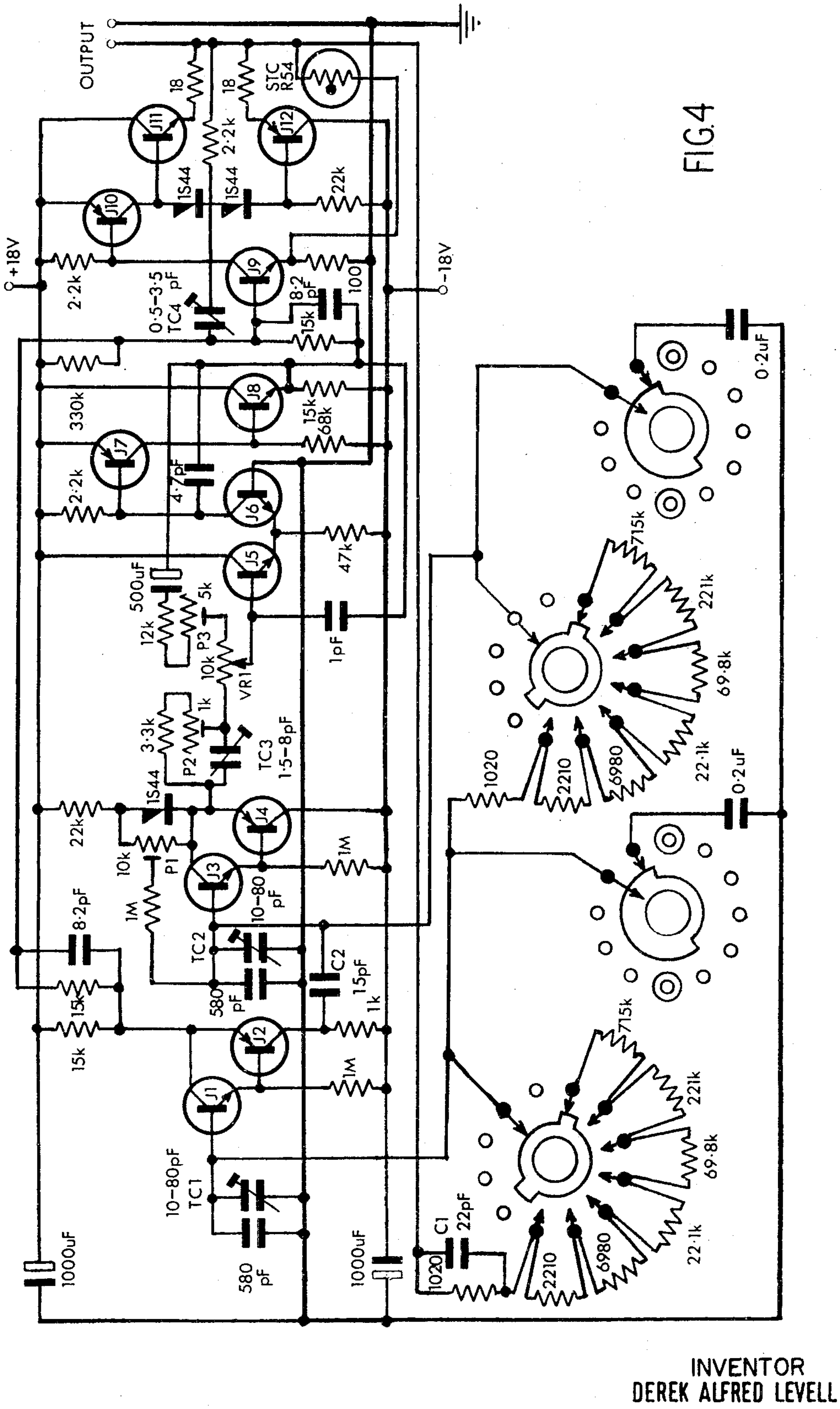
FIG. 4 is a circuit diagram of a practical embodiment of the invention.

The circuit given in FIG. 4 is a tested arrangement that generates sinusoidal oscillations at frequencies from 1Hz to 1MHz covered by 12 ranges with two scales per decade at intervals $\sqrt{10}$ : 1 apart. The circuit uses two cascaded integrator circuits that are directly coupled without a buffer stage. Component values are as indicated in FIG. 4.

Transistors J3 and J4 form a compound emitter follower which provides isolated coupling from the output of the two integrator circuits into a phase reversing amplifier that contains transistors J5, J6, J7 and J8. The gain of this amplifier is varied from −1.17 to −6.2 by adjustment of the "frequency" potentiometer VR1 that controls a shunt negative feedback configuration. The 12 ranges are selected by a rotary switch consisting of 4 ganged sections. Two sections vary the resistances in the two phase shifting networks from 1.037MΩ down to 1.02kΩ on the first seven ranges and from 102kΩ down to 1.02kΩ on the remaining five ranges. The capacity in each arm of the phase shifting networks is 634pF approximately on the last five ranges but is increased by 0.2μF on the first seven ranges through connections on the remaining two sections of the rotary switch. The trimmers TC1 and TC2 permit the ratio of these capacities to be set at exactly $100\sqrt{10}$ : 1 in each arm. The preset potentiometers P2 and P3 are adjusted to track the oscillator frequencies to agree with the scale calibration on say the range covering 1kHz to 3kHz. Transistors J1 and J2 form a compound emitter follower which provides isolated coupling from the junction of the two integrator circuits to one arm of an adding network. The output of the phase reversing amplifier is taken from the emitter of transistor J8 into the other arm of the adding network. Transistors J9, J10, J11 and J12 form the sustaining amplifier which is gain stabilized by a negative feedback network that includes a thermistor. The working gain of this amplifier is approximately 6 from the base of J9 to the output.

The gain of the phase inverting amplifier is very high at DC as a condenser is included in the negative feedback path to block the negative feedback at frequencies much lower than 1Hz. The emitter to base potential of transistor J5 is almost cancelled out by the emitter to base potential of transistor J6 and the emitter to base potential of transistor J3 is almost cancelled out by the emitter to base potential of transistor J4. The DC offset at the output of the oscillator is thus mainly determined by the potential drop that occurs in the resistive arms of the phase shifting networks due to the base currents of transistors J1 and J3. The preset potentiometer P1 applies bias current that is adjusted to ensure that the DC level on the output does not depend upon the position of the range switch.

At high frequencies the lags inherent in the amplifiers and emitter followers cause the frequency of the oscillation to be lower than expected. Condensers TC3, TC4 and C1 apply corrections to the circuit that permit the top ranges to be tracked to follow the same two scales that apply at medium frequencies. Stray capacity across the resistive arm of the second phase shifting network causes some amplitude bounce on the top five ranges but this is overcome by cancellation of the stray capacity by a signal of opposite phase taken from the collector of J2 through C2.

At low frequencies, errors occur in the frequency of the oscillator due to the time constants of the thermistor and the AC coupling in the feedback path of the phase inverting amplifier. The resistances in the arms of the phase shifting networks are made 1.037MΩ instead of 1,000 times 1.02kΩ in order to offset this error.

I claim:

1. An electronic circuit comprising: a first phase-shift network having an input constituting the circuit input and an output; a second phase-shift network having an input connected to the output of said first phase-shift network, whereby the first and second networks are connected in cascade, and an output; amplification circuitry having an input and an output and having its input connected to the output of said second phase-shift network and being adapted to deliver at its output an output signal in anti-phase with a corresponding input signal; summation circuitry having a first input connected to the output of said amplification circuitry, a second input connected to the output of said first phase-shift network and an output constituting the circuit output, whereby the circuit has an overall frequency response exhibiting a resonant frequency.

2. A circuit as set forth in claim 1, including a buffer amplifier having an input connected to said output of said first phase-shift network and an output connected to said input of said second phase-shift network and also to said second input of said summation circuitry.

3. A circuit as set forth in claim 1, each said phase-shift network comprising a resistance and a reactance so interconnected as to provide a phase lead between said output and said input of said network.

4. A circuit as set forth in claim 1, each said phase-shift network comprising a resistance and a reactance so interconnected as to provide a phase lag between said output and said input of said network.

5. A circuit as set forth in claim 1, wherein said amplification circuitry comprises a variable gain amplifier, whereby the resonant frequency of the overall circuit frequency response is variable and errors in component values of said phase-shift network may be compensated, both by varying the gain of said amplifier.

6. A circuit as set forth in claim 5, said amplifier comprising a gain control arrangement adapted to vary the gain of said amplifier to produce a percentage change in said resonant frequency irrespective of the frequency value thereof.

7. A circuit as set forth in claim 3, wherein the resistance of at least one of said phase-shift networks is a variable resistance, whereby the resonant frequency of the overall circuit frequency response is variable by varying said resistance.

8. A circuit as set forth in claim 4, wherein the resistance of at least one of said phase-shift networks is a variable resistance, whereby the resonant frequency of the overall circuit frequency response is variable by varying said resistance.

9. A circuit as set forth in claim 3, wherein the reactance of at least one of said phase-shift networks is a variable reactance, whereby the resonant frequency of the overall circuit frequency response is variable by varying said reactance.

10. A circuit as set forth in claim 4, wherein the reactance of at least one of said phase-shift networks is a variable reactance, whereby the resonant frequency of the overall circuit frequency response is variable by varying said reactance.

11. A circuit as set forth in claim 1, further comprising a variable gain feedback circuit having an input connected to said output of said summation circuitry and an output connected to said input of said first phase-shift network, whereby the circuit is selectively operable as a frequency selective amplifier tuned to said resonant frequency or as an oscillator operating at said resonant frequency, according to the gain of said feedback circuit.

12. A circuit as set forth in claim 11, said amplification circuitry comprising a gain control arrangement connected to receive a gain-control signal significant of the magnitude of a physical quantity, whereby when the circuit is operated as an oscillator the frequency of oscillation may be varied in accordance with said magnitude.

* * * * *